US010218314B2

(12) United States Patent
Jin et al.

(10) Patent No.: US 10,218,314 B2
(45) Date of Patent: Feb. 26, 2019

(54) COMMON GATE AMPLIFIER CIRCUIT AND POWER AMPLIFIER USING THE SAME

(71) Applicants: SAMSUNG ELECTRO-MECHANICS CO., LTD., Suwon-si (KR); Korea Advanced Institute of Science and Technology, Daejeon (KR)

(72) Inventors: Yun Su Jin, Daejeon (KR); Gyu Suck Kim, Suwon-si (KR); Song Cheol Hong, Daejeon (KR)

(73) Assignees: Samsung Electro-Mechanics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/431,278

(22) Filed: Feb. 13, 2017

(65) Prior Publication Data

US 2017/0366140 A1 Dec. 21, 2017

(30) Foreign Application Priority Data

Jun. 21, 2016 (KR) .................. 10-2016-0077495

(51) Int. Cl.
*H03F 3/217* (2006.01)
*H03F 1/02* (2006.01)
(Continued)

(52) U.S. Cl.
CPC .......... *H03F 1/0288* (2013.01); *H03F 1/223* (2013.01); *H03F 1/565* (2013.01); *H03F 3/193* (2013.01);
(Continued)

(58) Field of Classification Search
CPC ........ H03F 1/0288; H03F 1/565; H03F 3/193; H03F 3/2171; H03F 3/16; H03F 3/1935;
(Continued)

(56) References Cited

U.S. PATENT DOCUMENTS 5,327,097 A * 7/1994 Igarashi ............... H03G 1/0023
330/254
5,999,056 A * 12/1999 Fong ......................... H03F 1/22
330/278
(Continued)

FOREIGN PATENT DOCUMENTS

KR  10-2011-0092352 A   8/2011
KR  10-2013-0035372 A   4/2013
(Continued)

*Primary Examiner* — Khanh V Nguyen
(74) *Attorney, Agent, or Firm* — NSIP Law

(57) ABSTRACT

A power amplifier includes a common source amplifier and a common gate amplifier circuit. The common source amplifier circuit has a terminal connected to a radio frequency (RF) input terminal and uses a source terminal commonly as an input terminal and an output terminal of the power amplifier. The common gate amplifier circuit has a terminal connected to the common source amplifier circuit and another terminal connected to an RF output terminal, and uses a gate terminal commonly as the input terminal and the output terminal of the power amplifier. The common gate amplifier circuit includes a Doherty amplifier including a main power amplifier and an auxiliary power amplifier that is connected to the main power amplifier in parallel.

19 Claims, 11 Drawing Sheets

(51) Int. Cl.
*H03F 1/56* (2006.01)
*H03F 3/193* (2006.01)
*H03F 1/22* (2006.01)

(52) U.S. Cl.
CPC ..... *H03F 3/2171* (2013.01); *H03F 2200/387* (2013.01); *H03F 2200/451* (2013.01); *H03F 2200/72* (2013.01); *H03F 2200/75* (2013.01)

(58) Field of Classification Search
CPC .... H03F 3/345; H03F 2200/372; H03F 3/217; H03F 3/2173; H03F 2200/04
USPC .......................................... 330/277, 251, 311
See application file for complete search history.

(56) References Cited

U.S. PATENT DOCUMENTS

| | | | | |
|---|---|---|---|---|
| 6,046,640 | A * | 4/2000 | Brunner | H03F 1/22 330/254 |
| 6,600,371 | B2 * | 7/2003 | Cali | H03F 3/45089 330/149 |
| 7,164,318 | B2 * | 1/2007 | Costa | H03F 1/22 330/100 |
| 7,936,220 | B2 * | 5/2011 | Li | H03F 1/223 330/311 |
| 7,974,599 | B2 * | 7/2011 | Roufoogaran | H03F 3/193 330/144 |
| 8,405,462 | B2 * | 3/2013 | Martineau | H03F 3/193 330/311 |
| 8,466,749 | B2 * | 6/2013 | Ahn | H03G 1/0029 330/311 |
| 8,482,348 | B2 * | 7/2013 | Pinarello | H03F 1/0211 330/295 |
| 8,576,006 | B1 * | 11/2013 | Davis | H03F 1/223 330/254 |
| 9,543,909 | B2 * | 1/2017 | Takahashi | H03F 3/19 |
| 9,712,117 | B2 * | 7/2017 | Searle | H03F 1/0277 |
| 2004/0207471 | A1 * | 10/2004 | Raja | H03F 1/223 330/285 |
| 2007/0222515 | A1 * | 9/2007 | Koutani | H01L 27/0207 330/254 |
| 2009/0015335 | A1 * | 1/2009 | Floyd | G06F 17/5063 330/282 |
| 2011/0018635 | A1 * | 1/2011 | Tasic | H03F 1/223 330/277 |
| 2014/0232466 | A1 | 8/2014 | Park et al. | |

FOREIGN PATENT DOCUMENTS

| | | |
|---|---|---|
| KR | 10-2013-0037358 A | 4/2013 |
| WO | WO 2010/068926 A1 | 6/2010 |

\* cited by examiner

COMMON GATE AMPLIFIER CIRCUIT AND POWER AMPLIFIER USING THE SAME

CROSS-REFERENCE TO RELATED APPLICATION(S)

This application claims the benefit under 35 USC 119(a) Korean Patent Application No. 10-2016-0077495 filed on Jun. 21, 2016 in the Korean Intellectual Property Office, the entire disclosure of which is incorporated herein by reference for all purposes.

BACKGROUND

Field

The following description relates to a common gate amplifier circuit and a power amplifier using the same.

Description of Related Art

Due to an increase in the data transmission rates required in wireless communications systems, a complex digital modulation system such as a multicarrier system has been developed. Such a digital modulation system requires a high output range and linearity across such output range.

In the prior art, power amplifiers are designed as a cascode structure using two stacked transistors. However, such cascode amplifiers may have linearity characteristics but they have limited output range, which results in low efficiency of the amplifiers in the back-off region.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power amplifier includes a common source amplifier and a common gate amplifier circuit. The common source amplifier circuit has a terminal connected to a radio frequency (RF) input terminal and uses a source terminal commonly as an input terminal and an output terminal of the power amplifier. The common gate amplifier circuit has a terminal connected to the common source amplifier circuit and another terminal connected to an RF output terminal, and uses a gate terminal commonly as the input terminal and the output terminal of the power amplifier. The common gate amplifier circuit includes a Doherty amplifier including a main power amplifier and an auxiliary power amplifier that is connected to the main power amplifier in parallel.

The common gate amplifier circuit may further includes a load impedance adjusting circuit configured to adjust load impedance of the main power amplifier and load impedance of the auxiliary power amplifier.

The load impedance adjusting circuit may have a terminal connected to a drain terminal of the main power amplifier, and the other terminal connected to the RF output terminal and a drain terminal of the auxiliary power amplifier.

The load impedance adjusting circuit may include an inductor having a terminal connected to a drain terminal of the main power amplifier and the other terminal connected to a drain terminal of the auxiliary power amplifier; a first capacitor having a terminal connected to the drain terminal of the main power amplifier and the other terminal connected to a ground terminal; and a second capacitor having a terminal connected to the other terminal of the inductor and the other terminal connected to the ground terminal.

The common gate amplifier circuit may further include a phase shift circuit having a phase shift value corresponding to the load impedance adjusting circuit.

The load impedance adjusting circuit may be formed on the same path as the main power amplifier, and the phase shift circuit may be formed on the same path as the auxiliary power amplifier.

The phase shift circuit may be configured as a phi circuit corresponding to the load impedance adjusting circuit.

The common source amplifier circuit and the common gate amplifier circuit may be formed using a complementary metal oxide semiconductor (CMOS) process.

In another general aspect, a common gate amplifier circuit, applicable to a power amplifier having a cascode structure, the common gate amplifier circuit includes a Doherty amplifier comprising a main power amplifier and an auxiliary power amplifier that is connected to the main power amplifier in parallel; and a load impedance adjusting circuit adjusting load impedance of the main power amplifier and load impedance of the auxiliary power amplifier.

The load impedance adjusting circuit may have a terminal connected to a drain terminal of the main power amplifier, and the other terminal connected to an RF output terminal and a drain terminal of the auxiliary power amplifier.

The load impedance adjusting circuit may include an inductor having a terminal connected to a drain terminal of the main power amplifier and the other terminal connected to a drain terminal of the auxiliary power amplifier; a first capacitor having a terminal connected to the drain terminal of the main power amplifier and the other terminal connected to a ground terminal; and a second capacitor having a terminal connected to the other terminal of the inductor and the other terminal connected to the ground terminal.

The common gate amplifier circuit may further include a phase shift circuit having a phase shift value corresponding to the load impedance adjusting circuit.

The load impedance adjusting circuit may be formed on the same path as the main power amplifier, and the phase shift circuit is formed on the same path as the auxiliary power amplifier.

The phase shift circuit may be configured as a phi circuit corresponding to the load impedance adjusting circuit.

The main power amplifier, the auxiliary power amplifier, the load impedance adjusting circuit, and the phase shift circuit may be formed using a complementary metal oxide semiconductor (CMOS) process.

The main power amplifier may have a gate bias of a Class AB amplifier and the auxiliary power amplifier may have a gate bias of Class C amplifier.

In another general aspect, a differential power amplifier includes a first common source amplifier circuit coupled in parallel to a second common source amplifier circuit, each of the first and second source amplifier circuits being respectively coupled to a radio frequency (RF) input terminal, and each of the first and second source amplifier circuits respectively using a source terminal as an input terminal and an output terminal of the differential power amplifier; and a first common gate amplifier circuit coupled in parallel to a second common gate amplifier circuit, each of the first and second common gate amplifier circuits having a terminal respectively coupled to the first and second common source amplifier circuits and another terminal connected to an RF output terminal, and each of the first and second common gate amplifier circuits respectively using a gate terminal as the input terminal and the output terminal of the differential power amplifier. Each of the first and second common gate amplifier circuits comprises a Doherty amplifier comprising a main power amplifier and an auxiliary power amplifier that is connected to the main power amplifier in parallel.

The main power amplifier may have a gate bias of a Class AB amplifier and the auxiliary power amplifier may have a gate bias of Class C amplifier.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
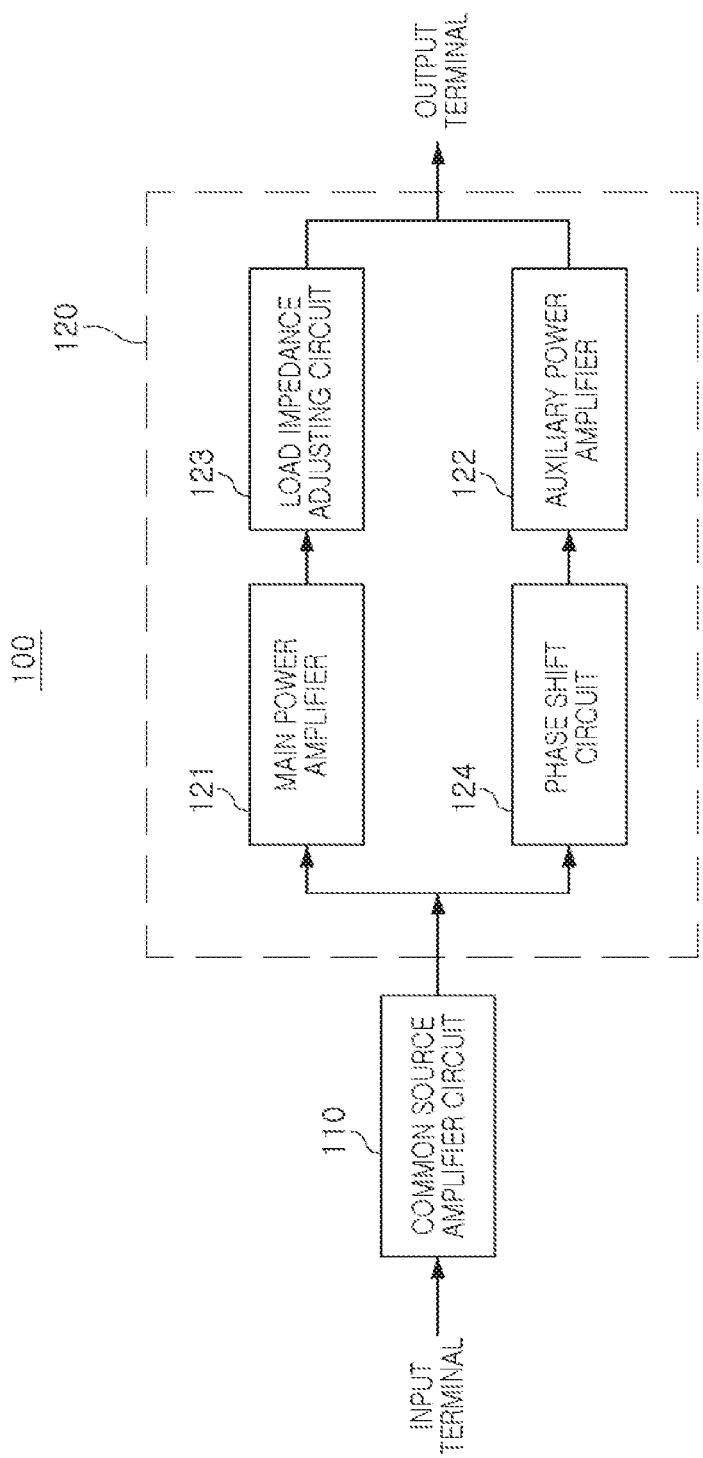
FIG. 1 is a block diagram illustrating an example of a power amplifier.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a block diagram illustrating an example of a power amplifier.

Referring to FIG. 1, a power amplifier 100 includes a common source amplifier circuit 110 and a common gate amplifier circuit 120.

The common source amplifier circuit 110 and the common gate amplifier circuit 120 are formed to have a cascode structure.

A terminal of the common source amplifier circuit 110 is connected to a radio frequency (RF) input terminal. The common source amplifier circuit 110 uses a source terminal as a common terminal to an input terminal and an output terminal. That is, in the common source amplifier circuit 110, the source terminal (or an emitter terminal) is commonly used as an input terminal and an output terminal of the amplifier.

A terminal of the common gate amplifier circuit 120 is connected to the common source amplifier circuit 110, and the other terminal thereof is connected to an RF output terminal. The common gate amplifier circuit 120 uses a gate terminal commonly at the time of performing an input and an output. That is, in the common gate amplifier circuit 120, the gate terminal (or a base terminal) is commonly used as an input terminal and an output terminal of the amplifier.

A wireless transceiver is produced in a complementary metal oxide semiconductor (CMOS) process, but when an amplifier is produced using the CMOS process, the amplifier may have low breakdown voltage characteristics. However, the required output of the wireless transceiver can be satisfied by using a cascode structure in which two amplifiers are stacked.

The common gate amplifier circuit 120 includes a Doherty amplifier including a main power amplifier 121 and an auxiliary power amplifier 122 which is connected to the main power amplifier in parallel.

The common gate amplifier circuit 120 is configured in the Doherty structure, and the main power amplifier 121 and the auxiliary power amplifier 122 are connected to the common source amplifier circuit 110 while having a structure sharing the common source amplifier circuit 110.

That is, the common gate amplifier circuit 120 is the Doherty amplifier using the main power amplifier 121 and the auxiliary power amplifier 122. Thereby, efficiency at a back-off power point of the power amplifier 100 is improved.

The common gate amplifier circuit 120 further includes a load impedance adjusting circuit 123. The load impedance adjusting circuit 123 adjusts load impedance of the main power amplifier 121 and load impedance of the auxiliary power amplifier 122.

A general Doherty amplifier adjusts the load impedance using a quarter-wave ($\lambda$/4) transmission line, but the load impedance adjusting circuit 123, according to the example, is implemented in an equivalent circuit of the $\lambda$/4 transmission line. That is, the load impedance adjusting circuit 123 is implemented in a circuit which is equivalent to the $\lambda$/4 transmission line, so as to also be applied to the CMOS process.

The common gate amplifier circuit 120 further includes a phase shift circuit 124. The phase shift circuit 124 is a circuit having a phase shift value corresponding to the load impedance adjusting circuit 123.

The load impedance adjusting circuit 123 is formed on a first path which is the same as the main power amplifier 121, and the phase shift circuit 124 is formed on a second path which is the same as the auxiliary power amplifier 122. That is, the load impedance adjusting circuit 123 and the main power amplifier 121 are connected to each other in series to be formed on one current path, and the phase shift circuit 124 and the auxiliary power amplifier 122 are connected to each other in series to be formed on another current path.

Since phases of the main power amplifier 121 and the auxiliary power amplifier 122 correspond to each other, a change in a phase of the first path can be caused by the load impedance adjusting circuit 123. Therefore, the phase shift circuit 124 allows phases of the first path and the second path to correspond to each other by applying a phase change corresponding to the load impedance adjusting circuit 123 to the second path.

Figure 2:
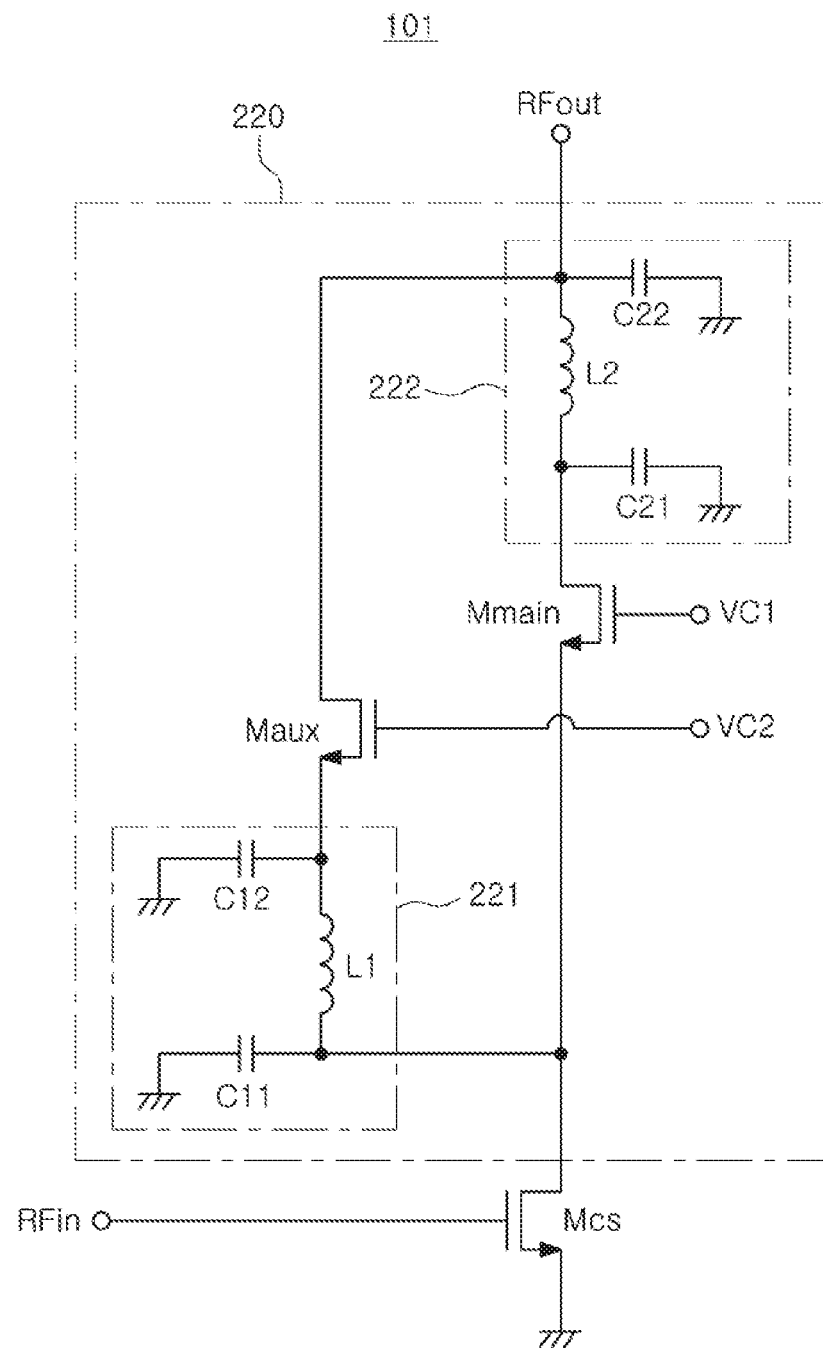
FIG. 2 is a circuit diagram illustrating an example of the power amplifier in FIG. 1.

FIG. 2 is a circuit diagram illustrating an example of the power amplifier according to an example in the present disclosure.

Referring to FIG. 2, a power amplifier 101 includes a common source amplifier Mcs and a common gate amplifier circuit 220.

The common gate amplifier circuit 220 includes a main amplifier Mmain and an auxiliary power amplifier Maux connected in parallel to the main amplifier Mmain.

The source terminal of the main amplifier Mmain is connected to the drain terminal of a common source amplifier Mcs, and a terminal of a load impedance adjusting circuit 222 is connected to the drain terminal of the main amplifier Mmain.

The other terminal of the load impedance adjusting circuit 222 is connected to the RF output terminal and the drain terminal of the auxiliary power amplifier Maux.

The load impedance adjusting circuit 222 is configured in a circuit having a phi ($\pi$) structure including an inductor and a capacitor. As described above, the load impedance adjusting circuit 222 is the equivalent circuit of the $\lambda$/4 transmission line, and may be a phi ($\pi$) circuit including one inductor L2 and two capacitors C21 and C22, for example.

Specifically, a terminal of the inductor L2 is connected to the drain terminal of the main amplifier Mmain, and the other terminal is connected to the RF output terminal and the drain terminal of the auxiliary power amplifier Maux.

A terminal of a first capacitor C21 is connected to the drain terminal of the main amplifier Mmain, and the other terminal is connected to a ground terminal.

A terminal of a second capacitor C22 is to the other terminal of the inductor L2, and the other terminal is connected to the ground terminal.

In a case of the main power amplifier having a gate bias of Class AB, optimum load impedance of the main power amplifier is not significantly changed in accordance with an increase in the input power. However, in accordance with the increase in input power, the auxiliary power amplifier having a gate bias of Class C is changed from a turned-off state to a turned-on state, and the optimum load impedance thereof is changed. Here, since the inductor having the $\pi$ structure is connected in series with the drain terminal of the main power amplifier and is connected in parallel to the drain terminal of the auxiliary power amplifier, the optimum load impedances required by the respective amplifiers are simultaneously satisfied. The capacitor within the $\pi$ structure performs additional impedance matching. Thereby, the impedance is changed to 50 ohms using one transmission line transformer in a state in which the drain terminals of the respective amplifiers are bound.

The source terminal of the auxiliary power amplifier Maux may be connected to a phase shift circuit 221, and the drain terminal thereof may be connected to an RF output terminal and the other terminal of the load impedance adjusting circuit 222.

The phase shift circuit 221 has a phase shift value corresponding to the load impedance adjusting circuit 222.

In the illustrated example, the phase shift circuit 221 is configured as a phi circuit corresponding to the load impedance adjusting circuit 222.

According to an example, the main amplifier Mmain and the auxiliary power amplifier Maux are simultaneously operated only in some sections. For example, only the main amplifier Mmain is operated up to a first point in output power, and the main amplifier Mmain and the auxiliary power amplifier Maux are operated from the first point to a second point in the output power. From the first point to the second point in the output power, the main amplifier Mmain and the auxiliary power amplifier Maux may be alternately operated. Alternatively, an output may occur based on the main amplifier at the first point, and the output may occur based on the auxiliary power amplifier at the second point. Thereafter, only the auxiliary power amplifier Maux may be operated from the second point to a third point. Here, the second point may correspond to the maximum output point of the main amplifier, and the third point may correspond to the maximum output point of the auxiliary power amplifier. That is, since the maximum output point of the auxiliary power amplifier is set to be higher than the maximum output point of the main amplifier, a wide output range and linearity may be simultaneously satisfied.

As illustrated in FIG. 2, in the power amplifier having the cascode structure, the common gate amplifier circuit is implemented as the Doherty amplifier, whereby the power amplifier has high efficiency in the back-off region of the output power while having linearity.

In addition, as illustrated, since the load impedance adjusting circuit 222 is used instead of the λ/4 transmission line of the Doherty amplifier, the common gate amplifier circuit may be produced by one complementary metal oxide semiconductor (CMOS) process. Therefore, there is an advantage that the common gate amplifier circuit may be produced by the configuration block of the wireless transceiver and the complementary metal oxide semiconductor (CMOS) process.

According to an example, only the main power amplifier Mmain is operated up to the maximum power point T of the main power amplifier Mmain. By simultaneously operating the main power amplifier Mmain and the auxiliary power amplifier Maux after the maximum power point T, an output of the auxiliary power amplifier Maux is added to an output of the main power amplifier Mmain. Here, the maximum power point T of the main power amplifier Mmain is a power back-off region of the maximum output power of the entirety of the power amplifier 101. FIG. 9 provides a more detailed description of the power back-off region.

FIGS. 3A-D are graphs depicting a change in load resistance and load reactance of the main power amplifier and the auxiliary power amplifier depending on whether the π structure positioned at the drain terminal of the power amplifier is present. The bolded line depicts a change in the load resistance and the reactance when the π structure is present, and the thin line depicts a change in the load resistance and the reactance when the π structure does not exist.

Figure 3A:
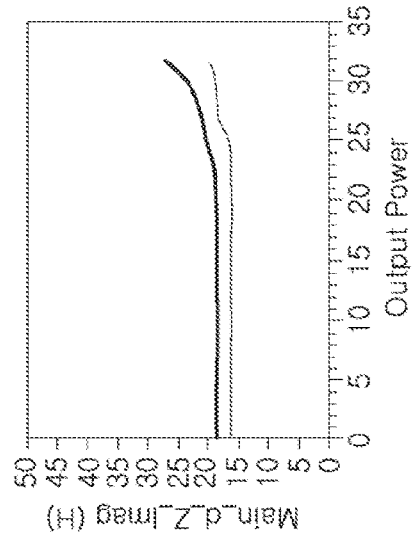
FIGS. 3A-3D and 4 are graphs illustrating the performance of the power amplifier illustrated in FIG. 2 depending on whether a load impedance adjusting circuit is present.
Figure 3B:
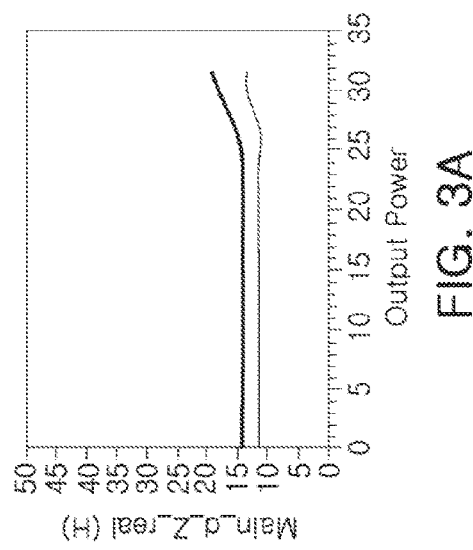

FIG. 3A depicts a change in the load resistance of the main power amplifier, and FIG. 3B depicts a change in the load reactance of the main power amplifier.

Figure 3C:
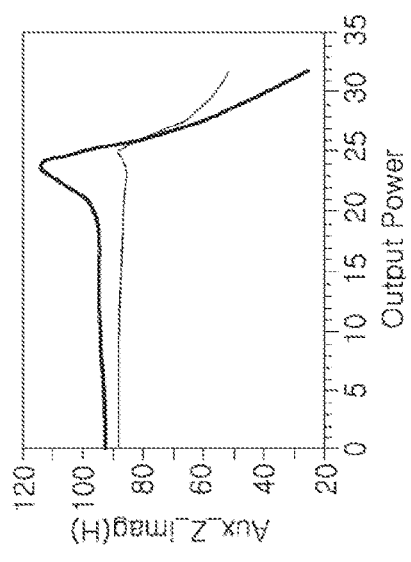
Figure 3D:
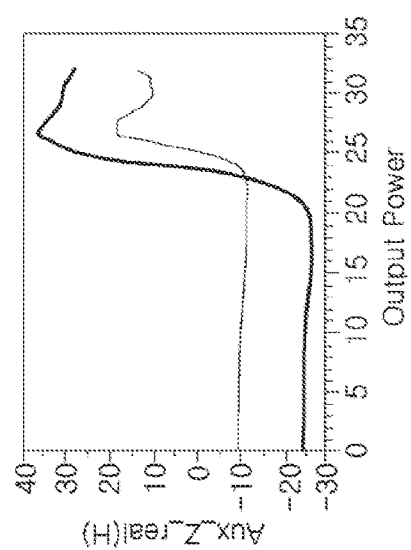

FIG. 3C depicts a change in the load resistance of the auxiliary power amplifier, and FIG. 3D depicts a change in the load reactance of the auxiliary power amplifier.

It is seen in FIGS. 3A-B that the load resistance and the load reactance do not significantly change based on whether the π structure is present. However the same is not true in the case of the auxiliary power amplifier depicted in FIGS. 3C-3D. The load resistance and the load reactance in FIGS. 3C-3D do significantly change when the auxiliary power amplifier has a high output power. Changes based on the presence of the load impedance circuit are depicted by a Smith chart in FIG. 4.

Figure 4:
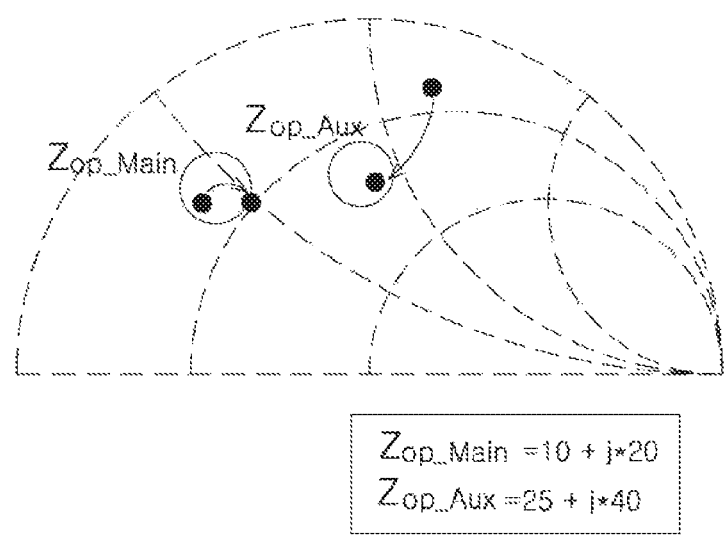

FIG. 4 depicts a change in load impedance depending on whether the load impedance adjusting circuit is present.

As depicted in FIG. 4, whether the load impedance adjusting circuit is present has a relatively small influence on the load impedance of the main power amplifier, and may adjust the load impedance of the auxiliary power amplifier to an optimum load impedance range. Therefore, the main power amplifier and the auxiliary power amplifier may simultaneously satisfy the optimum load impedance ranges, respectively.

In practical implementation, the load impedance adjusting circuit having the phi structure illustrated in FIG. 2 may be implemented to have very low inductance and low capacitance as compared to the λ/4 transmission line. That is, the inductor configuring the load impedance adjusting circuit may be miniaturized. Accordingly, a size of the power amplifier is reduced, and consequently, costs efficient.

Figure 5:
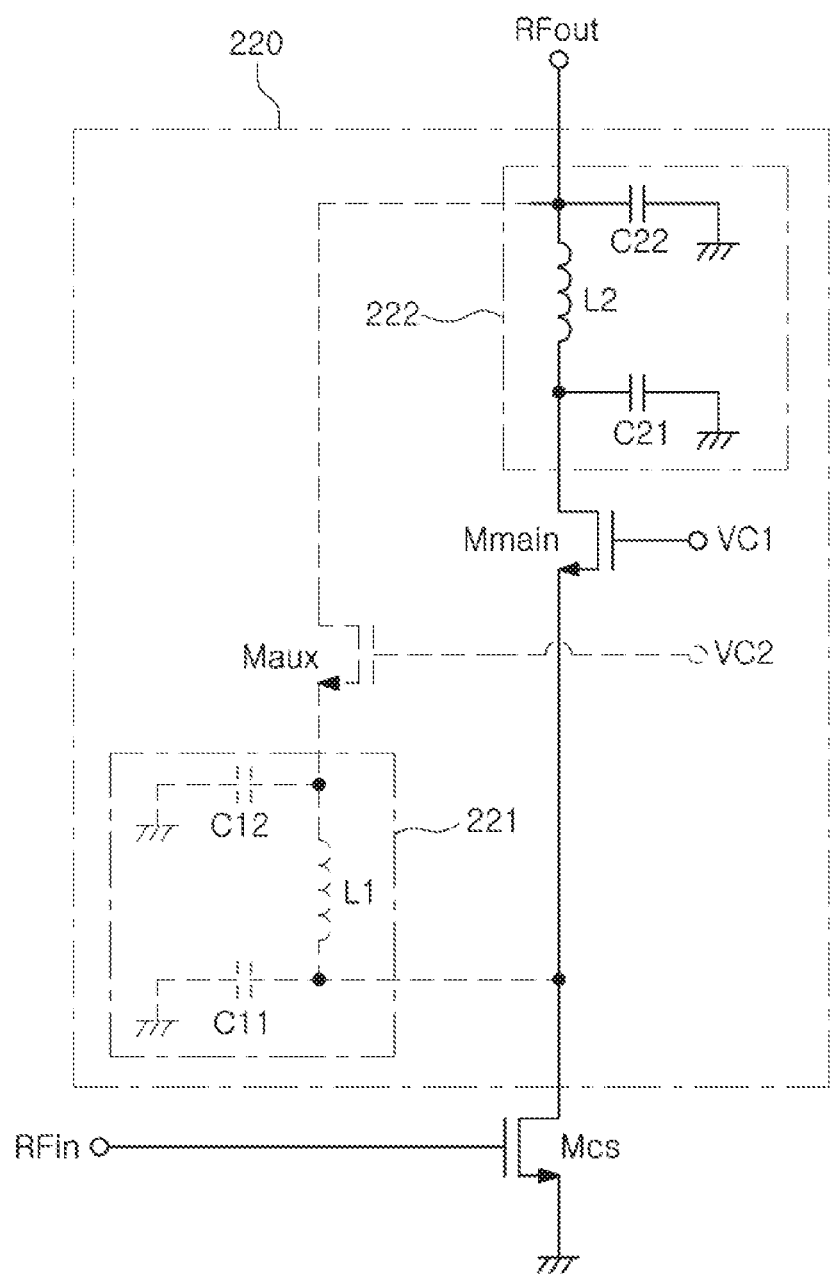
FIG. 5 is a circuit diagram illustrating an operation path of the main power amplifier in the power amplifier illustrated in FIG. 2.
Figure 6:
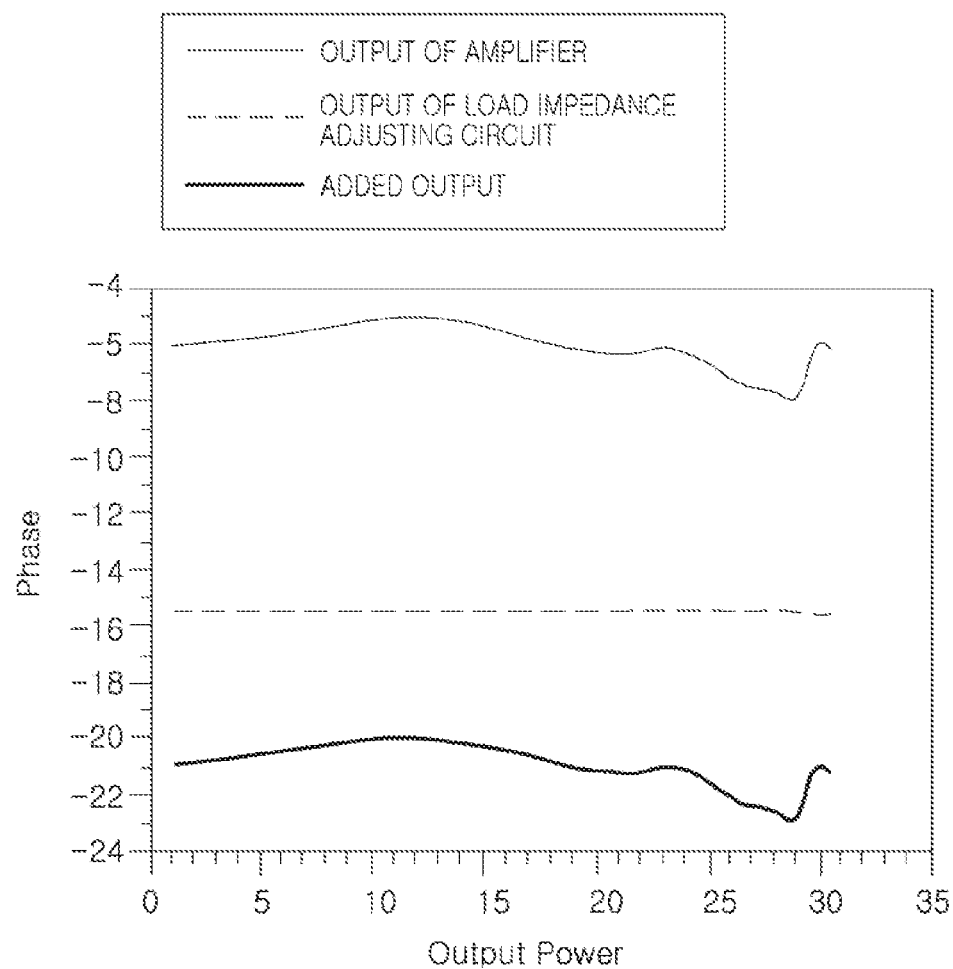
FIG. 6 is a graph illustrating a phase shift value of the main power amplifier illustrated in FIG. 5.

FIG. 5 is a circuit diagram depicting an operation path of the main power amplifier in the power amplifier illustrated in FIG. 2 and FIG. 6 is a graph depicting a phase shift value of the main power amplifier illustrated in FIG. 5.

FIG. 5 depicts a case in which the first path on which the main power amplifier Mmain is positioned is activated. The phase shift value of the main power amplifier depicted in FIG. 5 is illustrated in the graph of FIG. 6.

Figure 7:
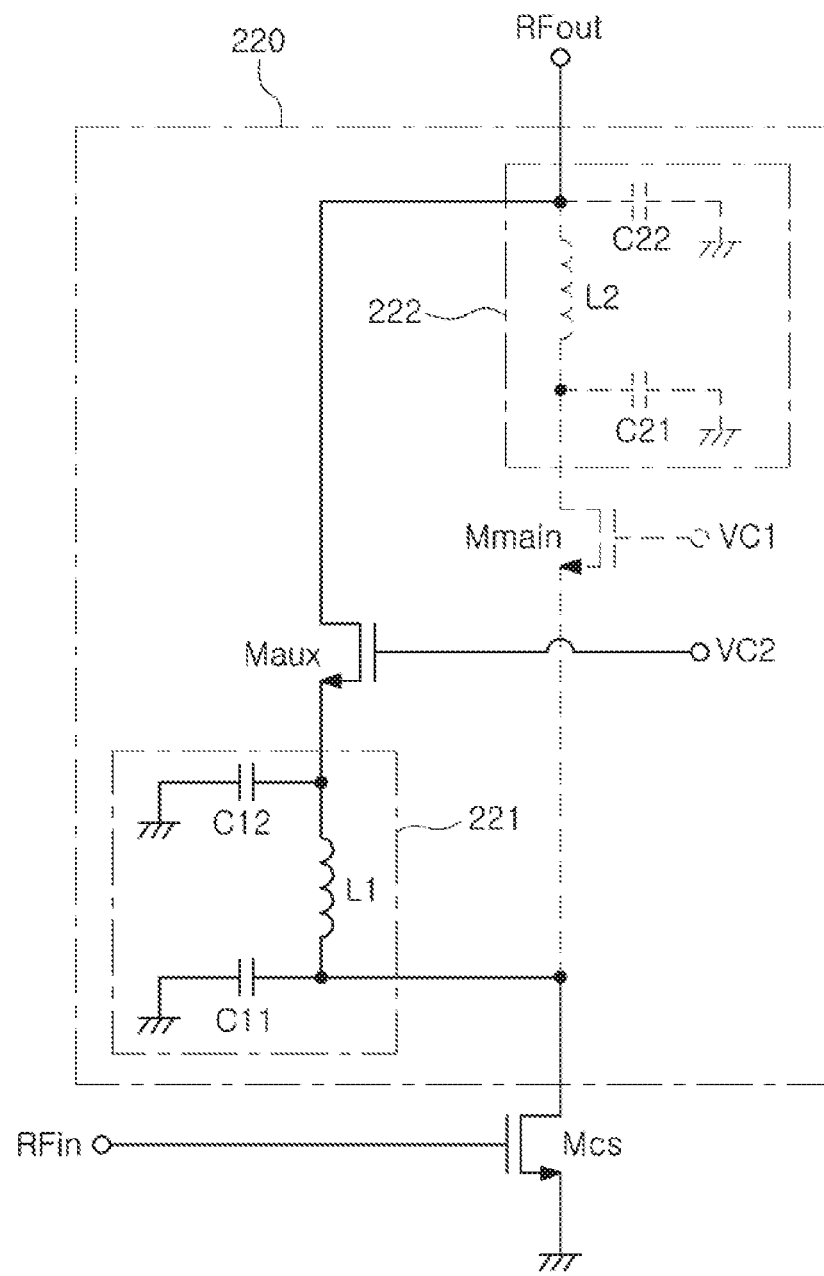
FIG. 7 is a circuit diagram illustrating an operation path of an auxiliary power amplifier in the power amplifier illustrated in FIG. 2.
Figure 8:
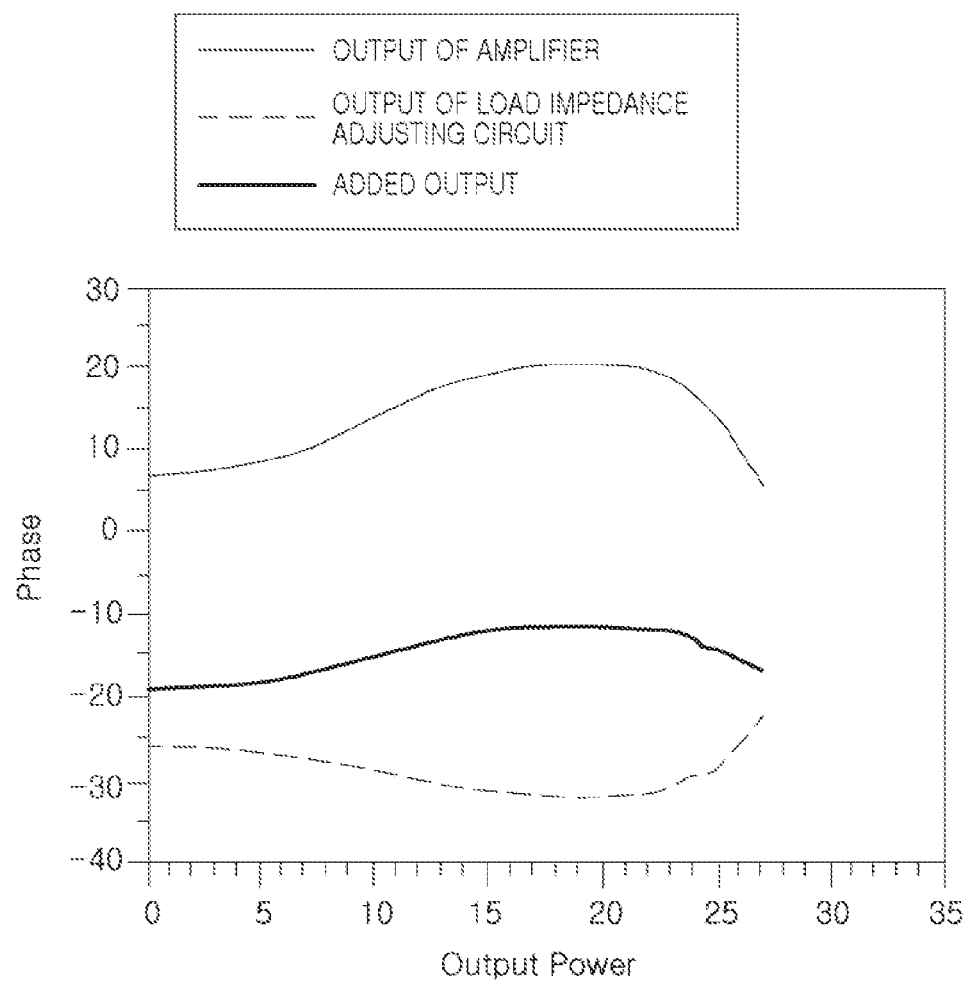
FIG. 8 is a graph illustrating a phase shift value of the auxiliary power amplifier illustrated in FIG. 7.

FIG. 7 is a circuit diagram depicting an operation path of the auxiliary power amplifier in the power amplifier illustrated in FIG. 2. FIG. 8 depicts a phase shift value of the auxiliary power amplifier illustrated in FIG. 7.

FIG. 7 depicts a case in which the second path on which the auxiliary power amplifier Maux is positioned is activated, and the phase shift value of the auxiliary power amplifier is depicted in the graph of FIG. 8.

As depicted in FIGS. 6 and 8, it is seen that a phase shift occurring on the first path on which the main power amplifier is present, and a phase shift occurring on the second path on which the auxiliary power amplifier is present correspond to each other.

As a result, it is seen that the phase shift value occurring on each of the first and second paths is approximately −20°.

In addition, as described above, since an inductor value of the load impedance adjusting circuit corresponds to a low inductance value, phase shift due to the inductor value of the load impedance adjusting circuit is minimized. Therefore, the phase shift that needs to be generated by a phase shift circuit is relatively small, which may result in the inductor of the phase shift circuit being relatively low. Therefore, the load impedance adjusting circuit and the phase shift circuit may be implemented in a miniaturized circuit, which increases cost efficiency.

Figure 9A:
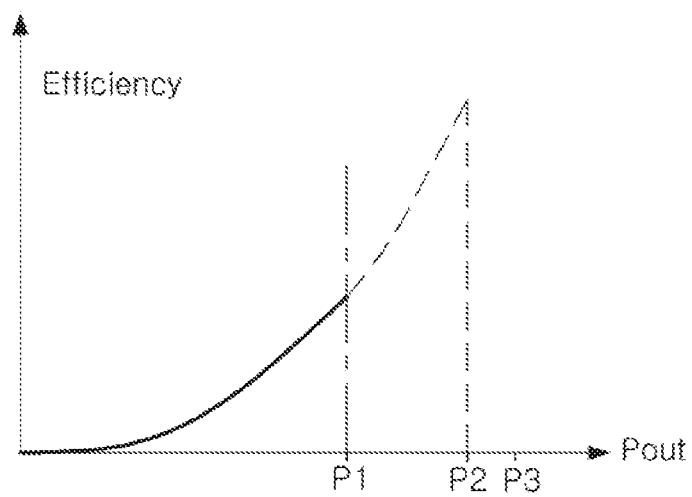
FIGS. 9A and 9B are graphs illustrating amplification efficiency of a common gate amplifier circuit according to an example.
Figure 9B:
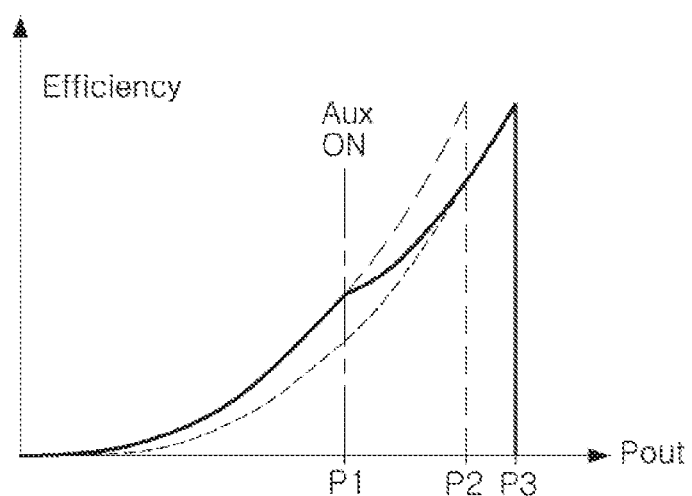

FIGS. 9A and 9B are graphs depicting amplification efficiency of the common gate amplifier circuit according to the examples in the present disclosure.

FIG. 9A depicts a power-efficiency graph of a case in which only the main power amplifier is operated up to a power point P1, in the power amplifier depicted in FIG. 2.

FIG. 9B depicts power-efficiency graphs of a case in which the main power amplifier and the auxiliary power amplifier are simultaneously operated from the power point P1 to a power point P2, and a case in which only the auxiliary power amplifier is operated from the power point P2 to a power point P3.

As described above, since the load impedance adjusting circuit provides the optimum load impedance for both of the main power amplifier and the auxiliary power amplifier, the main power amplifier and the auxiliary power amplifier may be simultaneously operated in a high power region (P1 to P2), as illustrated in FIGS. 9A and 9B.

Therefore, the common gate amplifier circuit may be operated at maximum efficiency by operating only the main power amplifier up to the maximum power point T of the main power amplifier. The maximum power point P1 of the main power amplifier may be the power back-off region of the maximum output power of the entirety of the power amplifier.

Therefore, by adding the output power of the auxiliary power amplifier after the power back-off region P1 of the maximum output power of the entirety of the power amplifier, the entirety of the power amplifier may have the maximum output power even after the power back-off region.

Figure 10:
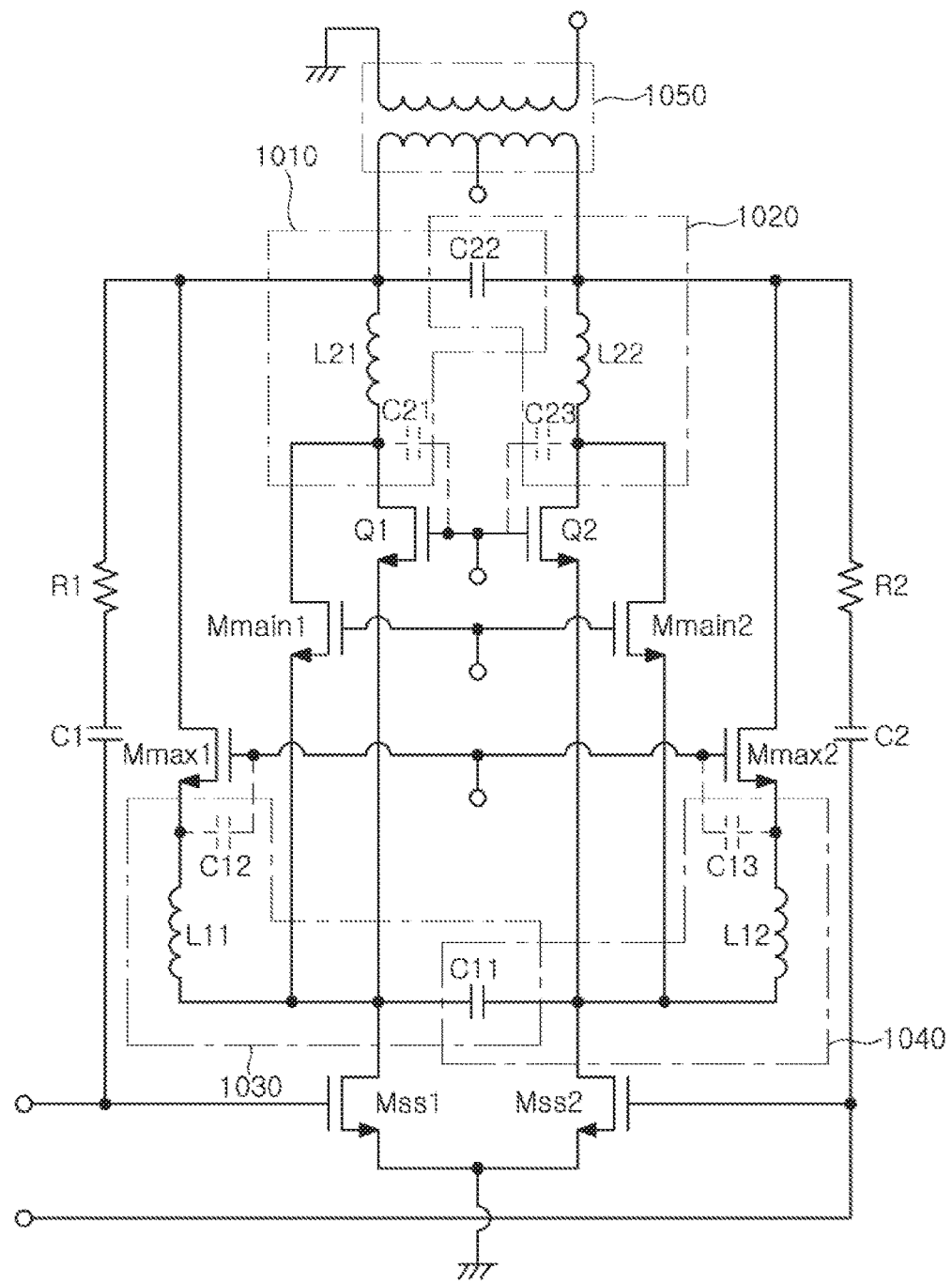
FIG. 10 is a circuit diagram illustrating another example of the power amplifier.

FIG. 10 is a circuit diagram illustrating another example of the power amplifier according to an example in the present disclosure.

FIG. 10 relates to an example in which a power amplifier is implemented in a differential structure.

FIG. 10 depicts an example in which the structure of the power amplifier described in FIG. 2 is implemented in a differential structure, and the respective differential structures include load impedance adjusting circuits 1010 and 1020, and phase shift circuits 1030 and 1040.

The load impedance adjusting circuits 1010 and 1020 and the phase shift circuits 1030 and 1040 are implemented to have a symmetrical structure, and in the illustrated example, the load impedance adjusting circuits 1010 and 1020, and the phase shift circuits 1030 and 1040 are implemented to have a symmetrical structure sharing one capacitor C11 or C22.

In order to solve the disadvantage of the CMOS process in which a ground via does not exist, the differential structure is used. Accordingly, stability of the circuit itself is increased by forming a virtual ground node within the circuit.

In addition, as described above, the load impedance adjusting circuits 1010 and 1020, and the phase shift circuits 1030 and 1040 are realized with an inductance and capacitance having a very small value.

As an example, the required capacitance may correspond to the parasitic capacitance caused by a transistor. Therefore, capacitors C12, C13, C21, and C23 may correspond to parasitic capacitances of the transistors Mmax1, Mmax2, Q1, and Q2, and not an actual capacitor.

A transmission line transformer 1050 matches impedance of an output portion to a predetermine value (e.g., 50 ohms) according to the differential structure.

Figure 11:
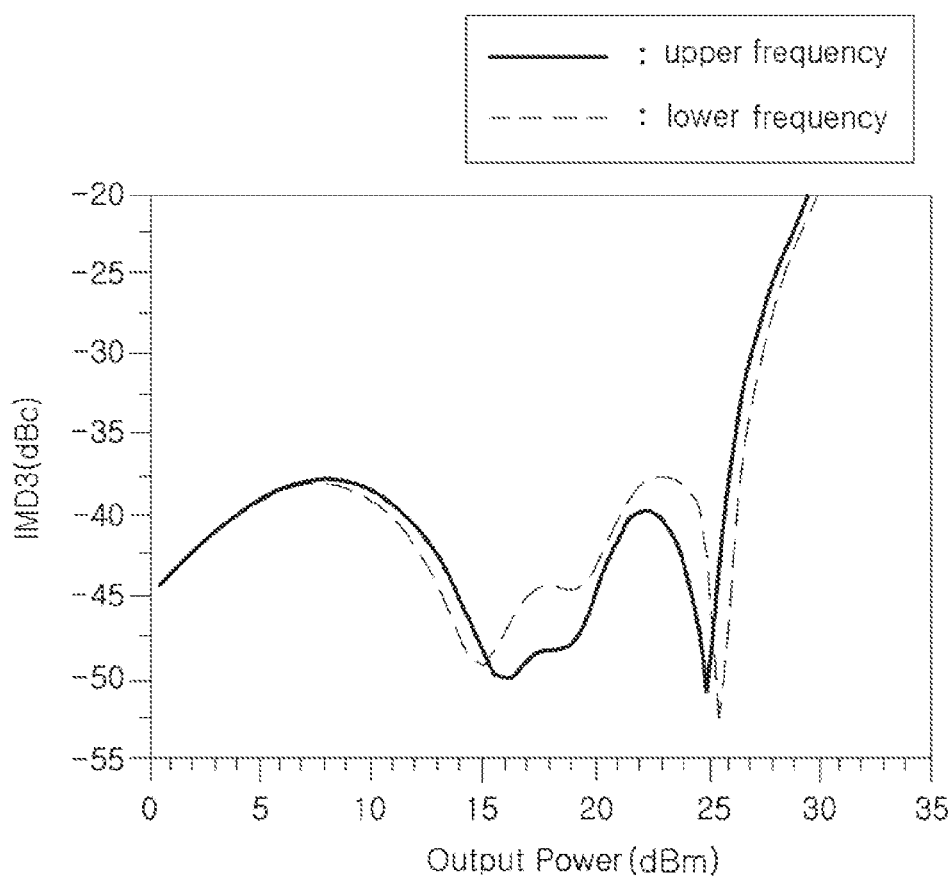
FIG. 11 is a graph illustrating output characteristics of the power amplifier illustrated in FIG. 10.

FIG. 11 is a graph depicting the output characteristics of the power amplifier illustrated in FIG. 10.

The graph depicted in FIG. 11 illustrates a third-order intermodulation distortion (IMD3) value for output power.

That is, a third-order term component obtained by simultaneously inputting a first frequency f1 and a second frequency f2 obtained by adding and subtracting a constant frequency to and from a fundamental frequency is depicted as IMD3, and the illustrated graph depicts an upper frequency (2f2−f1) and a lower frequency (2f1−f2), respectively.

Since third-order IMD3 component negatively affects an output, a third-order IMD3 component that is smaller than −30 dBc exhibits good characteristics and good linearity.

As illustrated in FIG. 11, in the present output characteristics, the third-order IMD3 component is decreased to approximately 12 dBm and 22 dBm. Accordingly, the power amplifiers of the examples in the present disclosure exhibit good third-order IMD3 characteristics in the entire range from 0 to about 23 dBm of the output power.

As illustrated in the examples above, the power amplifiers in the present disclosure have a high linearity in a wider output range when compared to the general amplifier of Class A, which has a linearity that is degraded at the output power of 15 dBm or more.

These characteristics are because the auxiliary power amplifier reinforces a power gain to improve the amplitude modulation to amplitude modulation (AM-AM) and reinforces the phase in an aspect opposite to the main power amplifier to improve AM-phase modulation (PM) around a high output power.

As set forth above, according to the examples in the present disclosure, the power amplifier has good linear characteristics in the entire output range while having high efficiency even in the back-off region of the output power, thus, providing a wide output range.

Since the power amplifier according to an example is formed in the complementary metal oxide semiconductor (CMOS) process, it may be manufactured in the same process as the configuration block of the wireless transceiver, whereby production efficiency may be improved.

As a non-exhaustive example only, a terminal/device/unit as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier comprising:
   a common source amplifier circuit comprising a terminal connected to a radio frequency (RF) input terminal; and
   a common gate amplifier circuit comprising:
      a terminal connected to the common source amplifier circuit;
      another terminal connected to an RF output terminal;
      a Doherty amplifier comprising a main power amplifier and an auxiliary power amplifier connected to the main power amplifier in parallel; and
      a load impedance adjusting circuit comprising a terminal connected to a drain terminal of the main power amplifier and another terminal connected to the RF output terminal and a drain terminal of the auxiliary power amplifier.

2. The power amplifier of claim 1, wherein the load impedance adjusting circuit is configured to adjust load impedance of the main power amplifier and load impedance of the auxiliary power amplifier.

3. The power amplifier of claim 2, wherein the load impedance adjusting circuit comprises:
   an inductor comprising a terminal connected to the drain terminal of the main power amplifier and another terminal connected to the drain terminal of the auxiliary power amplifier;
   a first capacitor comprising a terminal connected to the drain terminal of the main power amplifier and another terminal connected to a ground terminal; and
   a second capacitor comprising a terminal connected to the other terminal of the inductor and another terminal connected to the ground terminal.

4. The power amplifier of claim 2, wherein the common gate amplifier circuit further comprises a phase shift circuit having a phase shift value corresponding to the load impedance adjusting circuit.

5. The power amplifier of claim 4, wherein the load impedance adjusting circuit is formed on a same path as the main power amplifier, and
   the phase shift circuit is formed on a same path as the auxiliary power amplifier.

6. The power amplifier of claim 1, wherein the common source amplifier circuit and the common gate amplifier circuit are formed using a complementary metal oxide semiconductor (CMOS) process.

7. The power amplifier of claim 1, wherein the main power amplifier comprises a gate bias of a Class AB amplifier and the auxiliary power amplifier comprises a gate bias of Class C amplifier.

8. A device comprising the power amplifier of claim 1.

9. A power amplifier comprising:
   a common source amplifier circuit comprising a terminal connected to a radio frequency (RF) input terminal; and
   a common gate amplifier circuit comprising:
      a terminal connected to the common source amplifier circuit;
      another terminal connected to an RF output terminal;
      a Doherty amplifier comprising a main power amplifier and an auxiliary power amplifier connected to the main power amplifier in parallel; and
      a load impedance adjusting circuit configured to adjust load impedance of the main power amplifier and load impedance of the auxiliary power amplifier,
   wherein the load impedance adjusting circuit comprises a terminal connected to a drain terminal of the main power amplifier, and another terminal connected to the RF output terminal and a drain terminal of the auxiliary power amplifier.

10. A power amplifier comprising:
    a common source amplifier circuit comprising a terminal connected to a radio frequency (RF) input terminal; and
    a common gate amplifier circuit comprising:
       a terminal connected to the common source amplifier circuit;
       another terminal connected to an RF output terminal;
       a Doherty amplifier comprising a main power amplifier and an auxiliary power amplifier connected to the main power amplifier in parallel; and
       a phase shift circuit having a phase shift value corresponding to a load impedance adjusting circuit,
    wherein the phase shift circuit is configured as a pi circuit corresponding to the load impedance adjusting circuit.

11. A common gate amplifier circuit, applicable to a power amplifier comprising a cascode structure, the common gate amplifier circuit comprising:
    a Doherty amplifier comprising a main power amplifier and an auxiliary power amplifier that is connected to the main power amplifier in parallel; and
    a load impedance adjusting circuit configured to adjust load impedance of the main power amplifier and load impedance of the auxiliary power amplifier,
    wherein the load impedance adjusting circuit comprises a terminal connected to a drain terminal of the main power amplifier and another terminal connected to an RF output terminal and a drain terminal of the auxiliary power amplifier.

12. The common gate amplifier circuit of claim 11, wherein the load impedance adjusting circuit comprises:
    an inductor comprising a terminal connected to a drain terminal of the main power amplifier and another terminal connected to the drain terminal of the auxiliary power amplifier;
    a first capacitor comprising a terminal connected to the drain terminal of the main power amplifier and the another connected to a ground terminal; and
    a second capacitor comprising a terminal connected to the other terminal of the inductor and another terminal connected to the ground terminal.

13. The common gate amplifier circuit of claim 11, further comprising a phase shift circuit having a phase shift value corresponding to the load impedance adjusting circuit.

14. The common gate amplifier circuit of claim 13, wherein the load impedance adjusting circuit is formed on a same path as the main power amplifier, and
    the phase shift circuit is formed on a same path as the auxiliary power amplifier.

15. The common gate amplifier circuit of claim 13, wherein the phase shift circuit is configured as a pi circuit corresponding to the load impedance adjusting circuit.

16. The common gate amplifier circuit of claim 13, wherein the main power amplifier and the auxiliary power amplifier are formed using a complementary metal oxide semiconductor (CMOS) process.

17. A device comprising the common gate amplifier circuit of claim 11.

18. A differential power amplifier comprising:
a first common source amplifier circuit coupled in parallel to a second common source amplifier circuit, each of the first and second source amplifier circuits being respectively coupled to a radio frequency (RF) input terminal;
a first common gate amplifier circuit coupled in parallel to a second common gate amplifier circuit, each of the first and second common gate amplifier circuits comprising a terminal respectively coupled to the first and second common source amplifier circuits and another terminal connected to an RF output terminal, wherein each of the first and second common gate amplifier circuits comprises a Doherty amplifier comprising a main power amplifier and an auxiliary power amplifier that is connected to the main power amplifier in parallel; and
a load impedance adjusting circuit comprising a terminal connected to a drain terminal of the main power amplifier of the first common gate amplifier circuit and another terminal connected to the RF output terminal and a drain terminal of the auxiliary power amplifier.

19. The power amplifier of claim 18, wherein the main power amplifier comprises a gate bias of a Class AB amplifier and the auxiliary power amplifier comprises a gate bias of Class C amplifier.

* * * * *